(12) United States Patent  
Nagamori

(10) Patent No.: US 11,454,520 B2  
(45) Date of Patent: Sep. 27, 2022

(54) DISPLACEMENT DETECTION SENSOR AND FLEXIBLE DEVICE

(71) Applicant: Murata Manufacturing Co., Ltd., Nagaokakyo (JP)

(72) Inventor: Shiori Nagamori, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 259 days.

(21) Appl. No.: 16/847,932

(22) Filed: Apr. 14, 2020

(65) Prior Publication Data

US 2020/0240809 A1    Jul. 30, 2020

Related U.S. Application Data

(63) Continuation of application No. PCT/JP2019/040365, filed on Oct. 15, 2019.

(30) Foreign Application Priority Data

Oct. 16, 2018   (JP) .............................. JP2018-195399

(51) Int. Cl.
    *G01D 5/14*        (2006.01)
    *G08B 21/18*       (2006.01)
                  (Continued)

(52) U.S. Cl.
    CPC .............. *G01D 5/14* (2013.01); *G08B 21/182* (2013.01); *H01L 41/1132* (2013.01); *H01L 41/1138* (2013.01); *H05K 5/0017* (2013.01)

(58) Field of Classification Search
    CPC .... G01D 5/14; G08B 21/182; H01L 41/1132; H01L 41/1138; H01L 41/193;
                  (Continued)

(56) References Cited

U.S. PATENT DOCUMENTS 9,804,041 B2    10/2017   Tajitsu et al.
2012/0038570 A1*   2/2012   Delaporte ............. G06F 1/1643
                                              345/173

(Continued)

FOREIGN PATENT DOCUMENTS

JP     2014164602 A    9/2014
JP     2017142656 A    8/2017

(Continued)

OTHER PUBLICATIONS

International Search Report Issued for PCT/JP2019/040365, dated Dec. 24, 2019.

(Continued)

*Primary Examiner* — Quan Zhen Wang
*Assistant Examiner* — Rajsheed O Black-Childress
(74) *Attorney, Agent, or Firm* — ArentFox Schiff LLP

(57) ABSTRACT

A housing which is foldable along a folding position into a folded state. A displacement detection sensor is located in the housing and has a displacement detection film having a main surface. First and second electrodes are disposed on first and second spaced regions of the main surface, respectively. The displacement detection film is disposed in the housing so as to straddle the folding position with the first region of the main surface, and with it the first electrode, being located on a first side of the folding position and a second region of the main surface, and with it the second electrode, being located on a second, opposite side of the folding position.

6 Claims, 8 Drawing Sheets

(51) Int. Cl.
  *H01L 41/113* (2006.01)
  *H05K 5/00* (2006.01)
(58) Field of Classification Search
  CPC ........................ H05K 5/0017; H04M 2250/12;
          H04M 1/026; H04M 1/0214; H04M
                      1/0268; G01L 1/16
  See application file for complete search history.

(56) References Cited

U.S. PATENT DOCUMENTS

2015/0168237 A1  6/2015  Tajitsu et al.
2016/0313793 A1  10/2016  Hong et al.

FOREIGN PATENT DOCUMENTS

JP  2018072663 A  5/2018
WO  2013175848 A1  11/2013

OTHER PUBLICATIONS

Written Opinion of the International Searching Authority issued for PCT/JP2019/040365, dated Dec. 24, 2019.

\* cited by examiner

DISPLACEMENT DETECTION SENSOR AND FLEXIBLE DEVICE

CROSS REFERENCE TO RELATED APPLICATIONS

The present application is a continuation of International application No. PCT/JP2019/040365, filed Oct. 15, 2019, which claims priority to Japanese Patent Application No. 2018-195399, filed Oct. 16, 2018, the entire contents of each of which are incorporated herein by reference.

TECHNICAL FIELD

The present invention relates to a displacement detection sensor and a flexible device using the same.

BACKGROUND ART

Japanese Patent Application Laid-Open No. 2018-72663 (Patent Document 1) discloses a foldable display and a portable terminal device that is operated in a folded state. In a case where the portable terminal device is operated in the folded state, when the portable terminal device itself is flexible, the force of a displacement operation applied to the case by the user influences the degree of deformation of the portable terminal device itself. For example, one type of pressing operation will deform the entire portable terminal device to cause it to warp and a second type of pressing operation will press only one side of the device. However, these operation modes are not distinguished in the foldable portable terminal device.

Therefore, an object of the present invention is to provide a displacement detection sensor capable of distinguishing between a pressing operation for deforming the entire portable terminal device to cause it to warp and a pressing operation for pressing only one side of a housing in a folded state, and a flexible device using the same.

BRIEF SUMMARY OF THE INVENTION

A displacement detector sensor is located in a housing which is foldable along a folding position into a folded state. The displacement detection sensor comprises a displacement detection film having a main surface and first and second electrodes disposed on first and second spaced regions of the main surface, respectively. The displacement detection film is disposed in the housing so as to straddle the folding position with the first region of the main surface, and with it the first electrode, being located on a first side of the folding position and a second region of the main surface, and with it the second electrode, being located on a second, opposite side of the folding position.

The first and second electrodes overlap each other plan view when the housing is in the folded state. The electrodes can completely or partially overlap on another.

In a preferred embodiment, a processor (which can include a programmed computer and/or any other electric circuitry which carries out the noted functions) determines the type of pressing operation applied to the housing as a function of the outputs of the first and second electrodes. In a preferred embodiment, the processor (1) detects whether absolute values of outputs of each of the first and second electrodes exceed predetermined thresholds when the housing is pressed while it is in the folded state and (2) issues a warning indicating that the housing is in danger of being damaged when the absolute values of the outputs of both the first and second electrodes exceed a first threshold value.

The processor can also determine that a first pressing operation has been applied to the housing when the absolute value of the output of at least one of the first and second electrodes is equal to or less than a second threshold value, which is lower than the first threshold value and determine that a second pressing operation has been applied to the housing when the absolute values of the outputs of both the first and second electrodes are larger than the second threshold value and equal to or smaller than the first threshold value.

The displacement detection film preferably includes a chiral polymer and more preferably is polylactic acid.

DESCRIPTION OF THE PREFERRED EMBODIMENTS

Figure 1A:
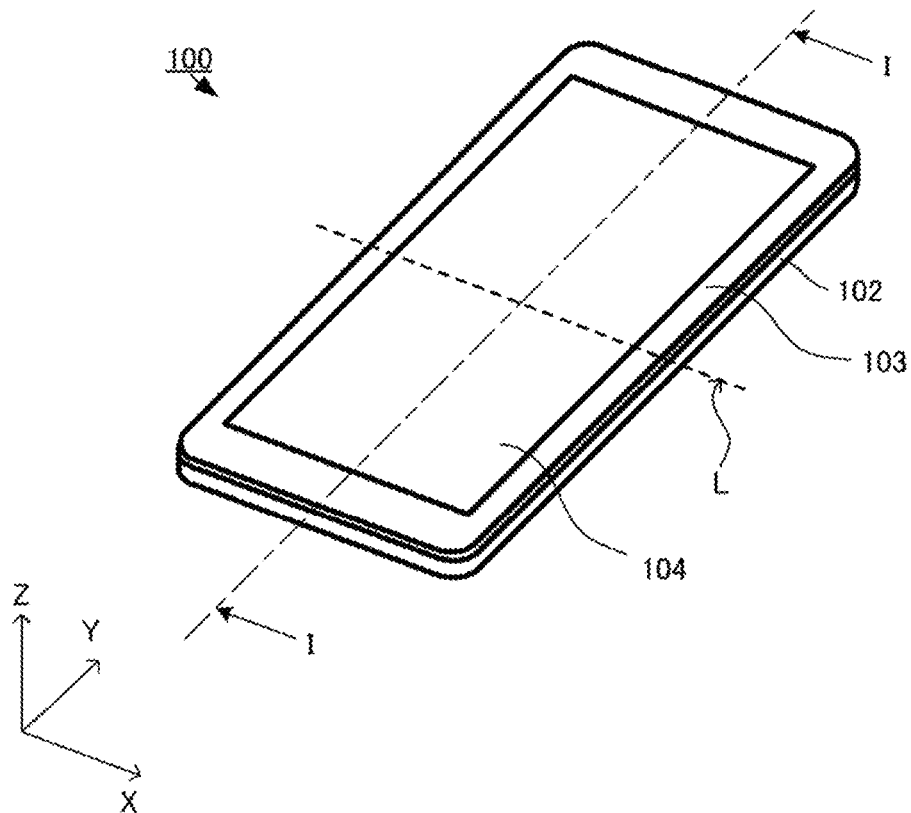
FIG. 1(A) is a perspective view of a flexible device including a pressure sensor according to a first embodiment.

A foldable housing and an associated displacement sensor in accordance with exemplary embodiments of the invention are disclosed below. In the drawings, wirings and the like are omitted for the sake of convenience in description.

Figure 1B:
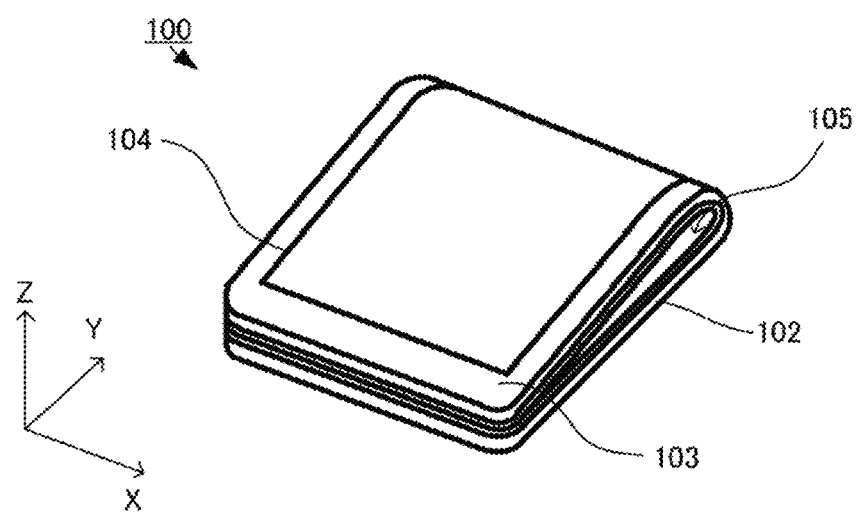
FIG. 1(B) is a perspective view of the flexible device in a folded state.

Referring now to the drawings wherein like numerals indicate like element, FIGS. 1(A) and 1(B) illustrate a first embodiment of the invention. This embodiment is merely an example of the present invention, and the present invention is not limited thereto. For example, the shape and the like of the pressure sensor can be appropriately changed according to the particular application of the sensor and the particular needs of the flexible device.

As illustrated in FIGS. 1(A) and 1(B), the flexible device 100 includes a foldable substantially rectangular parallelepiped housing 102. The housing 102 is flexible and can be deformed. The flexible device 100 includes a foldable flat plate type surface panel 103 disposed on a housing 102. The surface panel 103 functions as an operation surface on which a user performs a touch operation using a finger, a pen, a stylus or the like. The side of the housing 102 which is opposite the surface panel 103 will be referred to hereinafter as back surface 105. In FIG. 1(B), the flexible device 100 is foldable along a folding position L. Hereinafter, a width direction (horizontal direction as viewed in FIG. 1(A)) of the housing 102 is referred to as an X direction, a length direction (vertical direction) is referred to as a Y direction, and a thickness direction is referred to as a Z direction.

Figure 2A:
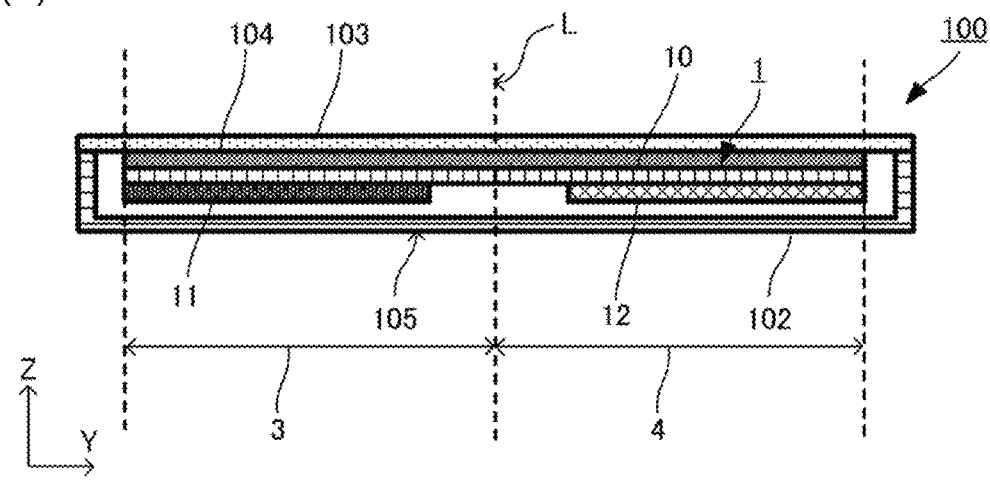
FIG. 2(A) is a cross-sectional view of the flexible device illustrated in FIG. 1(A).
Figure 2B:
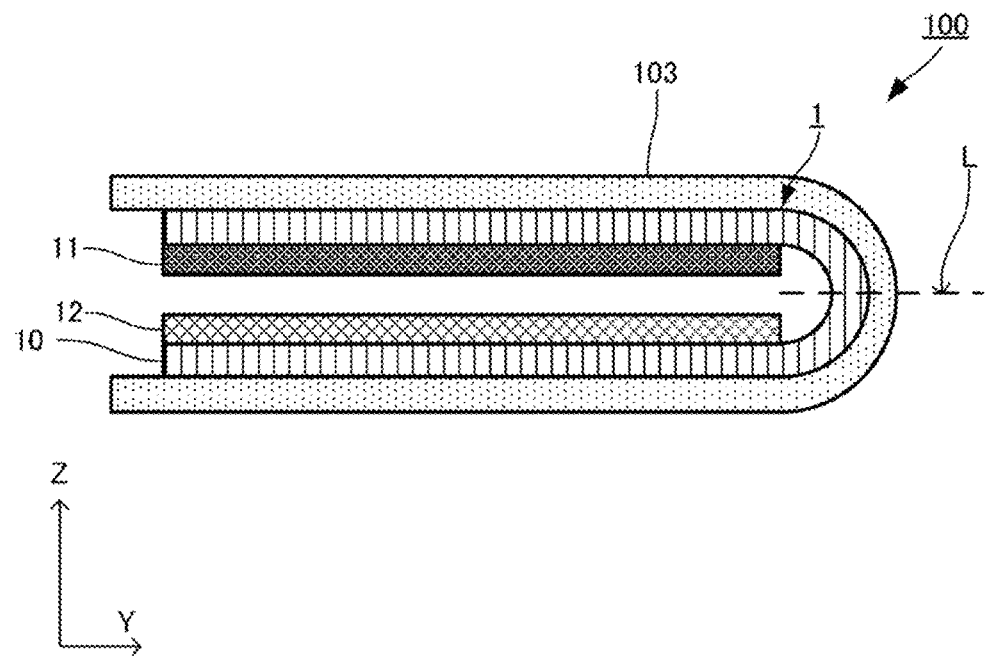
FIG. 2(B) is a partial cross-sectional view of the flexible device in the folded state.

FIG. 2(A) is a cross-sectional view of the flexible device illustrated in FIG. 1(A) taken along a line I-I of FIG. 1(A), and FIG. 2(B) is a partial cross-sectional view of the flexible device in the folded state. FIGS. 2(A) and 2(B) are schematic diagrams, and a thickness of each component of the pressure sensor and the like are illustrated in an enlarge state for the sake of convenience in description.

As illustrated in FIG. 2(A), the flexible device 100 includes a pressure sensor 1 located inside the housing 102. The pressure sensor 1 is formed on a surface of the surface panel 103 located inside the housing 102. The flexible device 100 also includes a foldable display unit 104 which is also located inside the housing 102. The surface panel 103 and the display unit 104 are arranged so as to be stacked on each other. If the pressure sensor 1 is transparent, it can be arranged so as to be closer to a front side of the flexible device 100 than the display unit 104 (the top side of display unit 104 as viewed in FIG. 2(a)).

The pressure sensor 1 includes a bendable piezoelectric film 10, a first electrode 11, and a second electrode 12. The piezoelectric film 10 is disposed on the housing 102 so as to straddle the folding position L of the flexible device 100. The piezoelectric film 10 is divided into first and second regions 3 and 4 on opposite sides of the folding position L. The first electrode 11 is disposed in the first region 3, and the second electrode 12 is disposed in the second region 4. In FIGS. 2(A) and 2(B), components of the pressure sensor 1 other than the piezoelectric film 10, the first electrode 11, and the second electrode 12 are not illustrated. In the present embodiment, the piezoelectric film 10 is an example of a displacement detection film.

Preferably, the entire flexible device 100 is made of a flexible material. In the first embodiment, the flexible device 100 can be folded at the folding position L along the X direction as a bending line. That is, the flexible device 100 can be opened and closed about the folding position L as an axis.

When the user performs a touch operation on the surface panel 103 using a finger, a pen, or the like, a pressing force is transmitted to the pressure sensor 1 (and therefore the piezoelectric film 10) via the surface panel 103. As will be described in more detail below, the pressure sensor 1 outputs a potential corresponding to a value of the pressing force generated by a pressing operation received on the surface panel 103.

FIG. 2(B) illustrates a state in which the flexible device 100 is folded such that the surface panel 103 is on the outside of the folded device 100 with respective portion of the back surface 105 facing one another. While this is the preferred mode of operation, the present invention is not so limited. For example, the flexible device 100 may be folded in the opposite direction such that the back surface 105 of the housing 102 of the flexible device 100 faces outwardly and becomes an operation surface to which the pressing force is applied.

When the flexible device 100 is folded along the folding position L, the first and second electrodes 11 and 12 completely overlap in a Z-axis direction. That is, the first electrode 11 and the second electrode 12 completely overlap in plan view (as viewed in the X-Y plane). Accordingly, in a state in which the flexible device 100 is folded along the folding position L, when the flexible device 100 is pressed from either the side corresponding to the first electrode 11 or the side corresponding to the second electrode 12, similar results (described further below) are obtained since the flexible device 100 has a structure that is symmetrical with respect to the folding position L. For example, when the flexible device 100 receives the pressing operation from the first electrode 11 side, a positive charge is generated in the first electrode 11, and a negative charge is generated in the second electrode 12. When the flexible device 100 receives the pressing operation from the second electrode 12 side, a negative charge is generated at the first electrode 11, and a positive charge is generated at the second electrode 12.

Figure 3:
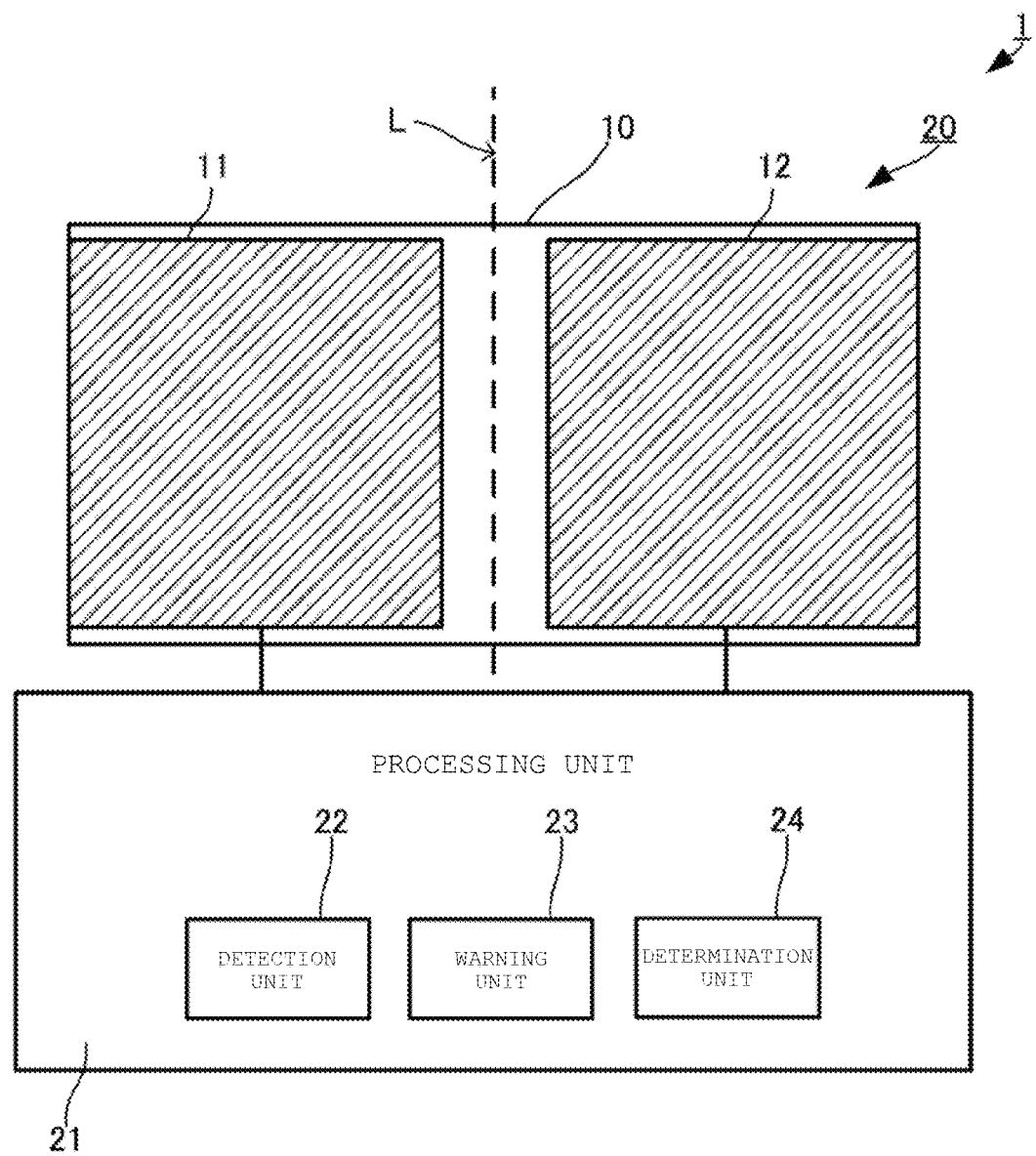
FIG. 3 is a conceptual diagram for describing the pressure sensor according to the first embodiment.

FIG. 3 is a conceptual diagram for describing the pressure sensor according to the first embodiment. As illustrated in FIG. 3, the pressure sensor 1 includes a sensor element 20 and a processing unit 21. The processing unit 21 (which can include a programmed microprocessor) includes a detection unit 22, a warning unit 23, and a determination unit 24.

Figure 4A:
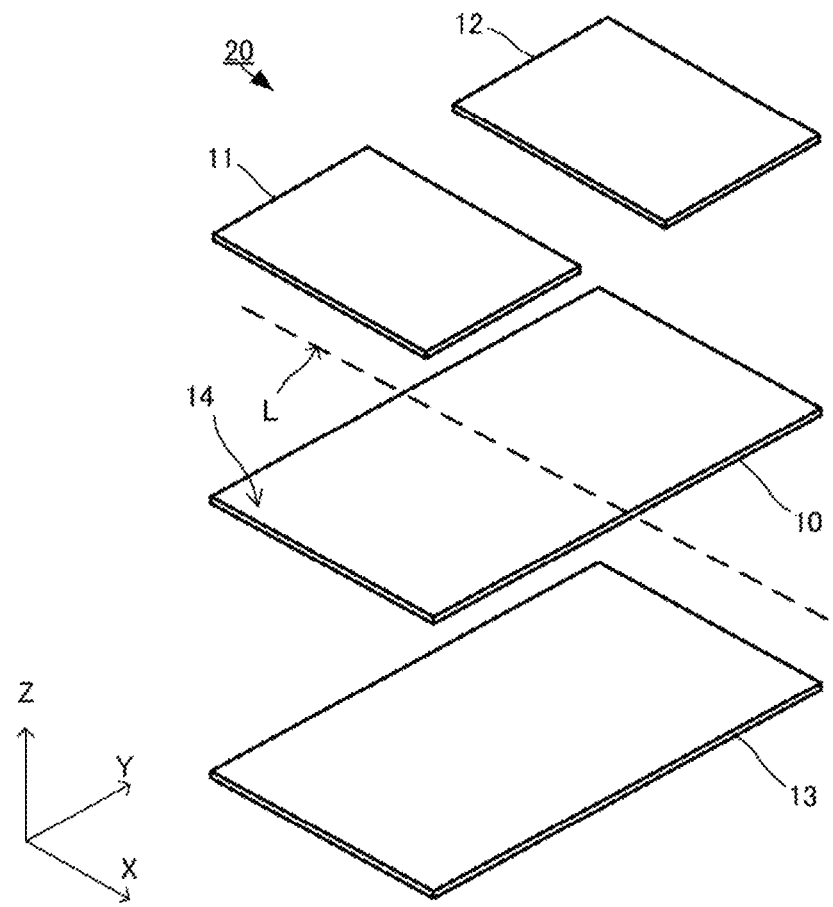
FIG. 4(A) is an exploded perspective view of a sensor element according to the first embodiment.
Figure 4B:
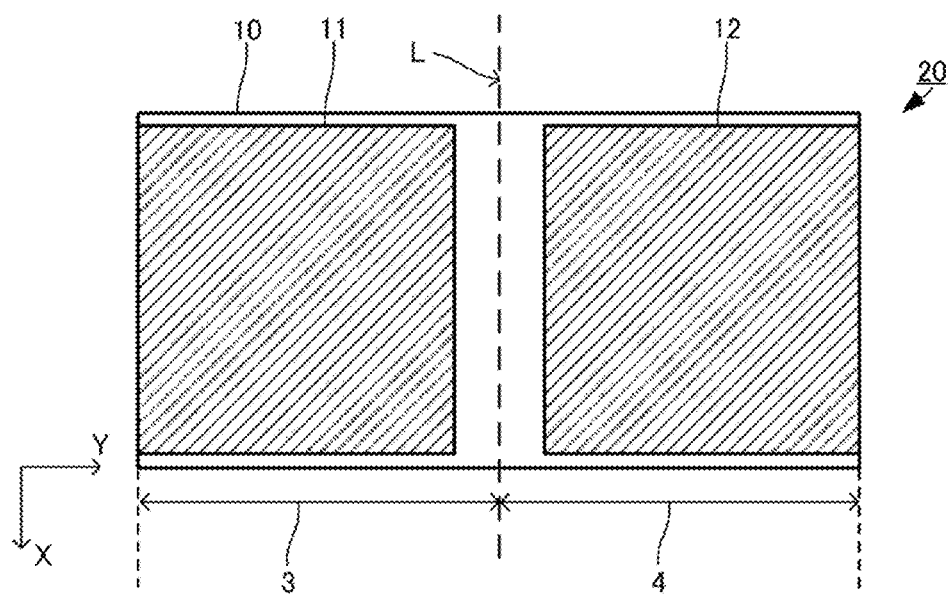
FIG. 4(B) is a plan view of the sensor element.

FIG. 4(A) is an exploded perspective view of the sensor element according to the first embodiment, and FIG. 4(B) is a plan view of the sensor element in an X-Y plane. As illustrated in FIGS. 4(A) and 4(B), the sensor element 20 includes the piezoelectric film 10, the first electrode 11, the second electrode 12, and a reference electrode 13. In FIGS. 4(A) and 4(B), components other than the piezoelectric film 10, the first electrode 11, the second electrode 12, and the reference electrode 13 are not illustrated.

The piezoelectric film 10 has a first and second main surfaces 14 and 15. The first and second electrodes 11 and 12 have a flat film rectangular shape and are provided on opposite lateral sides of the first main surface 14 of the piezoelectric film 10. The first and second electrodes 11 and 12 are arranged side by side in the Y direction, orthogonal to the X direction, along the folding position L. The reference electrode 13 is provided on the second main surface 15 of the piezoelectric film 10.

When the sensor element 20 is viewed in plan view as illustrated in FIG. 4(B), the first, second and reference electrodes 11, 12, and 13 may completely overlap the piezoelectric film 10 as viewed in top view, or may be positioned on an inner side in a plane direction than the piezoelectric film 10. Accordingly, the sensor element 20 can suppress a short circuit at ends of the first electrode 11, the second electrode 12, and the reference electrode 13.

Figure 5:
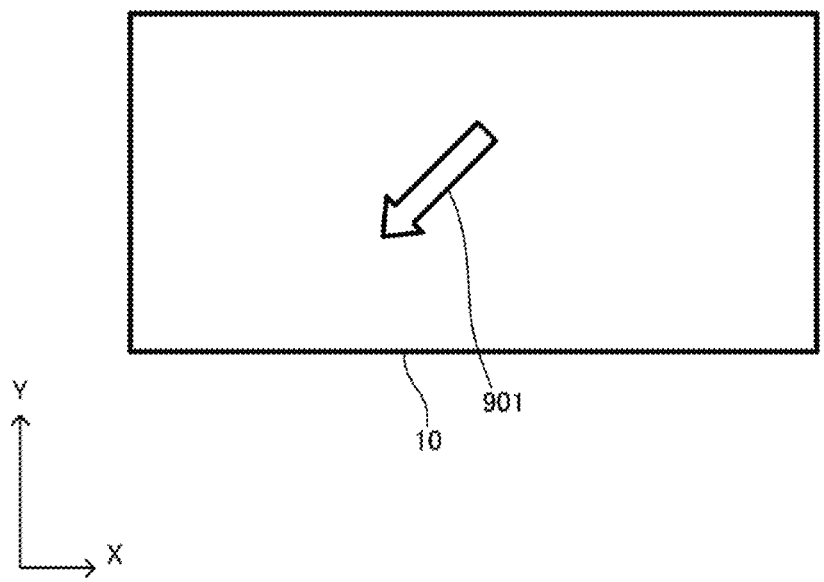
FIG. 5 is a diagram for describing a piezoelectric film according to the first embodiment.

FIG. 5 is a plan view of the piezoelectric film 10. The piezoelectric film 10 may be a film made of a chiral polymer. In the first embodiment, polylactic acid (PLA), particularly poly-L-lactic acid (PLLA) is used as the chiral polymer. In the PLLA including the chiral polymer, a main chain has a helical structure. The PLLA uniaxially extends, and has piezoelectricity when molecules are oriented. A flat plate surface of the piezoelectric film 10 is pressed, and thus, the uniaxially extended PLLA generates the charges. At this time, the amount of generated charges depends on the amount of displacement of the flat plate surface displaced in a direction orthogonal to the flat plate surface due to the pressing amount of the flat plate surface.

In the first embodiment, the uniaxially extending direction of the piezoelectric film 10 (PLLA) is a direction forming an angle of 45 degrees with respect to the Y direction and the Z direction, as illustrated by an arrow 901 of FIG. 5. The 45 degrees include angles including, for example, about 45 degrees ±10 degrees. Accordingly, the piezoelectric film 10 is pressed, and thus, the charges are generated.

Since the piezoelectricity is generated by orientation treatment of molecules through extending of the film and the like, the PLLA does not need to perform poling treatment such as other polymers such as PVDF and piezoelectric ceramics. That is, the piezoelectricity of the PLLA which does not belong to ferroelectrics is not expressed by the polarization of ions as in ferroelectrics such as PVDF, PZT, or the like, but is derived from a helical structure which is a characteristic structure of molecules. Thus, the PLLA does not have pyroelectricity generated in other ferroelectric piezoelectric materials. Since there is no pyroelectricity, the influence of frictional heat or a temperature of the finger of the user does not occur, and thus, the pressure sensor 1 can be formed to be thin. A piezoelectric constant of the PVDF and the like varies over time, and the piezoelectric constant is significantly decreased in some cases. However, a piezoelectric constant of the PLLA is extremely stable over time. Therefore, the displacement caused by the pressure can be detected with high sensitivity without being influenced by the surrounding environment.

Metal-based electrodes such as aluminum and copper can be used as the first, second and reference electrodes 11, 12, and 13. When the electrodes are required to have transparency, some or all of the first, second and reference electrodes 11, 12, and 13 can be made of a highly transparent material such as ITO or PEDOT. Charges generated by the piezoelectric film 10 are output to the processing unit 21, and are converted into a voltage in a circuit (not illustrated) of the processing unit 21. Thus, a voltage value corresponding to the pressing amount is detected.

When the housing 102 receives a pressing operation (i.e., the housing is pressed), charges are received by the first and/or second electrodes 11, 12 and the sensor element 20 outputs a signal indicative of those charges to the processing unit 21.

The detection unit 22 detects whether the absolute values of the outputs from the first and second electrodes 11 and 12 exceed predetermined threshold values described below. The warning unit 23 issues a warning (preferably to the user of the flexible device 100) when the detection unit detects that the absolute values of the outputs from both the first and second electrodes 11 and 12 exceed a relatively high first threshold value (e.g., 10 volts) indicating that the flexible device 100 is in danger of being damaged. The determination unit 24 determines a degree of deformation of the housing itself based on the output from the first and second electrode 11 or 12. Hereinafter, processing of the detection unit 22, the warning unit 23, and the determination unit 24 in response to different degrees of deformation of the housing 102 (caused by the pressing operation of the user) when the housing 102 is in a folded state will be described.

Figure 6A:
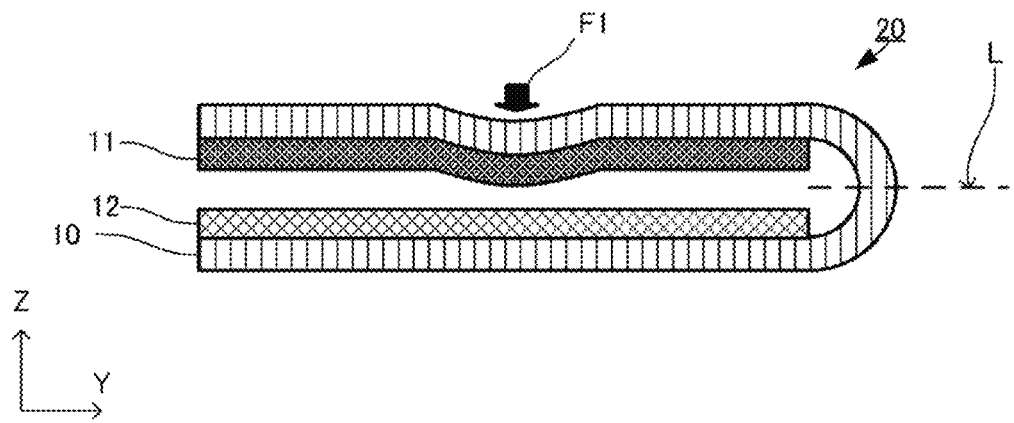
FIGS. 6(A) to 6(C) are schematic cross-sectional views showing a degree of deformation of the pressure sensor caused by a pressing operation of a user in a state in which the flexible device according to the first embodiment is folded.
Figure 6B:
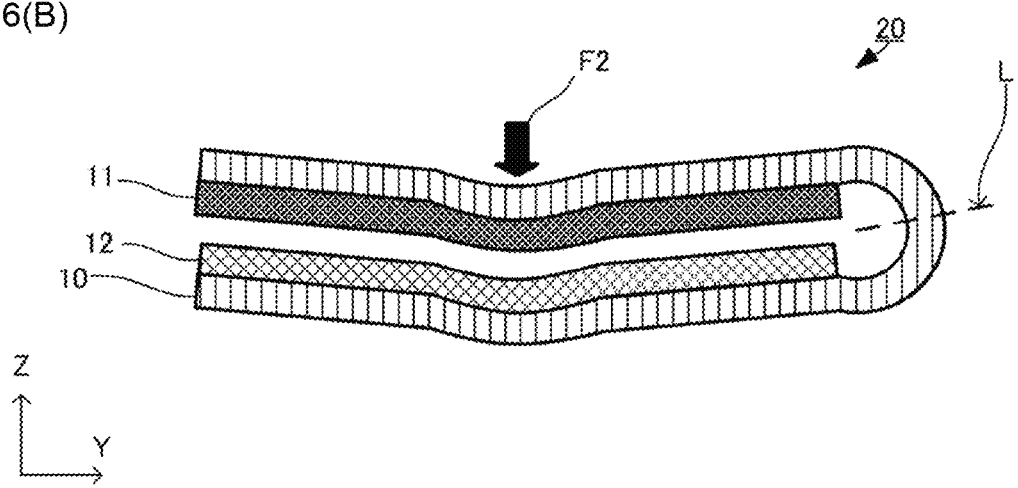
Figure 6C:
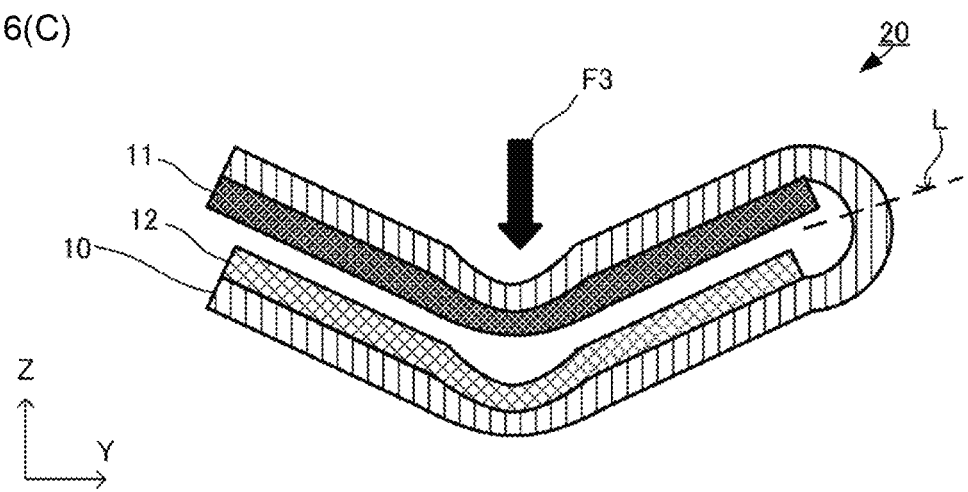

FIGS. 6(A) to 6(C) are schematic cross-sectional views for describing a degree of deformation of the pressure sensor 1 caused by the pressing operation of the user in a state in which the flexible device 100 according to the first embodiment is folded. In each of FIGS. 6(A) to 6(C), the flexible device 100 is folded in the same manner as in FIG. 2(B) such that the surface panel 103 faces outwardly and offset sections (corresponding generally to first and second regions 3 and 4 of FIG. 2(B)) of the back surface of the flexible device face one another. In FIGS. 6(A) to 6(C), components other than the piezoelectric film 10, the first electrode 11, and the second electrode 12 are not illustrated. Hereinafter, a case where the user performs the pressing operation on the portion of the surface panel 103 of the flexible device 100 corresponding to the location of the first electrode 11 will be described.

FIG. 6(A) illustrates the deformation of the pressure sensor 1 when a pressing operation having a value of a force F1 is applied to a portion of the surface panel 103 corresponding to the first region 3 of the piezoelectric film. The force F1 is relatively weak and only deforms the upper side of the housing 102 (i.e., deforms a portion of the housing corresponding to region 3 but not region 4 of the piezoelectric film 10). As a result, only the piezoelectric film 10 on the side on which the first electrode 11 is disposed is deformed. The first region 3 of piezoelectric film 10 is bent in a direction from the surface panel 103 side toward the back surface 105 of the surface panel 103 in the flexible device 100.

Due to the deformation of the piezoelectric film 10, the first electrode 11 outputs charges having a polarity corresponding to the deformation direction. Here, when the piezoelectric film 10 is deformed in the direction from the surface panel 103 side toward the back surface 105 of the flexible device 100, the first electrode 11 receives positive charges from the piezoelectric film 10, and outputs the positive charges to the processing unit 21. The processing unit 21 converts the received positive charges into a voltage.

During the pressing operation illustrated in FIG. 6(A), the second region of the piezoelectric film 10 is not deformed. As a result, there is no output from the second electrode 12, and the voltage detected by the processing unit 21 from the second electrode is 0 V.

When the force F1 is slightly larger and causes the second region of the piezoelectric film 10 (on the second electrode 12 side) to be deformed, the second region 4 of the piezoelectric film 10 is bent in a direction from the back surface 105 of the flexible device 100 toward the surface panel 103 side. The deformation of the piezoelectric film 10 is reversed on the side on which the first electrode 11 is disposed and on the side on which the second electrode 12 is disposed and the polarity of the charge received by the first electrode 11 from the piezoelectric film 10 and the polarity of the charge received by the second electrode 12 are opposite.

Therefore, the voltages detected by the processing unit 21 have opposite polarities on the first and second electrodes 11 and 12. For example, the voltage detected by the processing unit 21 from the first electrode 11 is 2 V, and the voltage detected by the processing unit 21 from the second electrode 12 is −1 V. As stated above, when the deformation of the second region 4 of the piezoelectric film 10 is smaller than the deformation of the first region 3 of the piezoelectric film 10, the absolute value of the voltage detected from the second electrode 12 is smaller than the absolute value (2 V) of the voltage detected from the first electrode 11. In contrast, when the deformation of the first and second regions (corresponding to the first and second electrodes 11, 12, respectively) are similarly deformed, the absolute values of the detected voltages become the same.

The detection unit 22 detects whether the voltage detected from either the first or second electrodes 11 or 12, but not both of them, exceeds a second threshold value (which is less than the first threshold value). When the detection unit 22 detects that the absolute value of the voltages detected from the first electrode 11 or the second electrode 12 (but not both) is equal to or larger than the second threshold value, for example, 3 V, the determination unit 24 determines that the surface panel 103 on one side of the housing 102 is being pressed and it is being pressed with a relatively small force F1 which only causes one side of the housing 102 to bend (the condition illustrated in FIG. 6(A) when the pressing force is applied to the upper portion of the housing).

FIG. 6(B) illustrates a condition wherein a higher pressing force F2 (a pressing force which is greater than F1) is applied to the surface panel 103 of housing 102. Pressing force F2 is sufficiently large to cause both the upper and lower sections of the housing 102 be bend. Here, both sides of the housing 102 (and therefore both the first and second regions 3,4 of the piezoelectric film 10) are deformed. However, this force is not sufficient to destroy (permanently injure) the housing 102. The detection unit 22 detects this situation when the absolute values of the voltages detected from the first and second electrode 11 and 12 are both equal to or larger than the second threshold value but lower than the first threshold value. The fact that the voltages detected from the first and second threshold values are both equal to or larger than the first threshold value (but less than the first threshold value) can also indicate that a pressing force has been applied to both the upper and lower portions of the housing and that neither of these pressing forces is sufficiently large to permanently damage the housing.

When, as shown in FIG. 6(C), a force F3 which is sufficiently large to permanently injure the housing is applied to the upper surface (more generally either the upper or lower surfaces) of the housing, the absolute values of the voltages detected from the first and/or second electrodes 11 and 12 will be greater than the first threshold value (e.g., 10 v), and the detection will send a signal to warning unit 23 indicating that the force applied to the housing 102 is sufficiently high that it may permanently damage the housing. [A similar result can occur when the force applied to both the upper and lower portions of the housing 102 are sufficiently large. In this case, the absolute values of the voltages detected at both the first and second electrodes 11 and 12 will be higher than the first threshold value.] The warning unit 23 preferably sends a warning to the user of this fact so that he or she can reduce the force applied to the housing and thereby protect the housing and the components therein.

The first region 3 of the piezoelectric film 10 on the side on which the first electrode 11 is arranged is bent in the direction from the surface panel 103 toward the back surface 105 of the flexible device 100. The degree of deformation of the piezoelectric film 10 caused by the deformation of the housing 102 is different depending on the force of the pressing operation applied to the pressure sensor 1 by the user.

As the deformation of the housing 102 becomes larger, the absolute values of the charges detected at the first and second electrodes 11 and 12 become larger (but opposite in polarity). Accordingly, the absolute values of the voltages detected by the processing unit 21 from the first electrode 11 side and the second electrode 12 side are increased. For example, the voltage detected by the processing unit 21 from the first electrode 11 side is 5 V, and the voltage detected by the processing unit 21 from the second electrode 12 side is −5 V.

When the detection unit 22 detects that the absolute values of the voltages detected from either the first and/or the second electrodes 12 are larger than the second threshold value but equal to or smaller than the first threshold value, the determination unit 24 determines that the pressing operation is received in a state in which the housing 102 itself is deformed so as to warp. The first threshold value will be described below in detail. In this manner, in the state in which the flexible device 100 is folded, the second pressing operation for deforming the entire housing 102 to warp and the first pressing operation for pressing only one side of the housing 102 can be distinguished.

In a case where the surface panel 103 of the flexible device 100 receives the pressing operation, the detection unit 22 detects that the absolute values of the voltages detected from the first and second electrodes 11 and 12 are larger than the first threshold value, for example, 10 V, the determination unit 24 determines that the pressing operation applied to the flexible device 100 has a force capable of damaging the flexible device 100. As described above, the degree of deformation of the housing 102 itself caused by the pressing operation of the user can be distinguished by the values of the voltages detected from the first electrode 11 and the second electrode 12.

When the absolute values of the voltages detected from both the first and second electrodes 11 and 12 exceed the first threshold value, the warning unit 23 issues a warning signal which can be used to inform the user (or something or someone else) that the flexible device 100 is in a state of receiving the pressing operation having the force that may damage the flexible device 100. Accordingly, the flexible device 100 can be prevented from being damaged. This warning may be issued in various ways, for example, by displaying a warning on the display unit 104, issuing an alarm sound, or sending a notification to another.

Figure 7A:
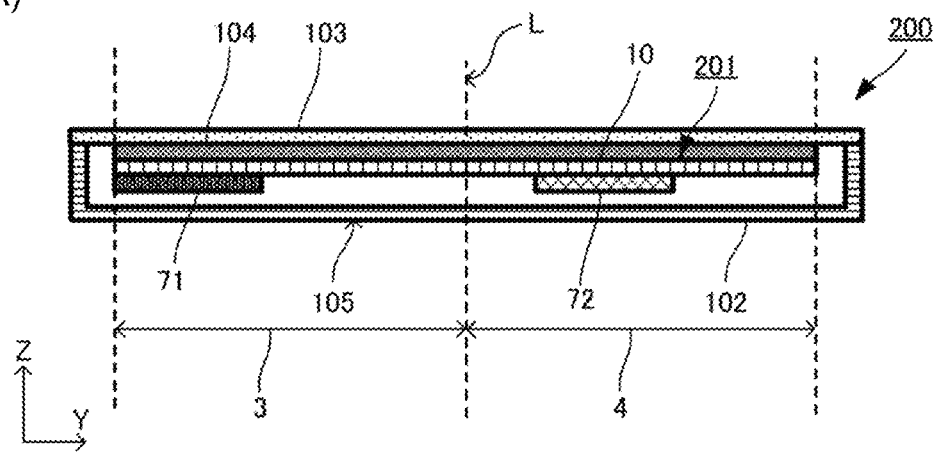
FIGS. 7(A) to 7(C) are diagrams for describing a flexible device according to a second embodiment.
Figure 7B:
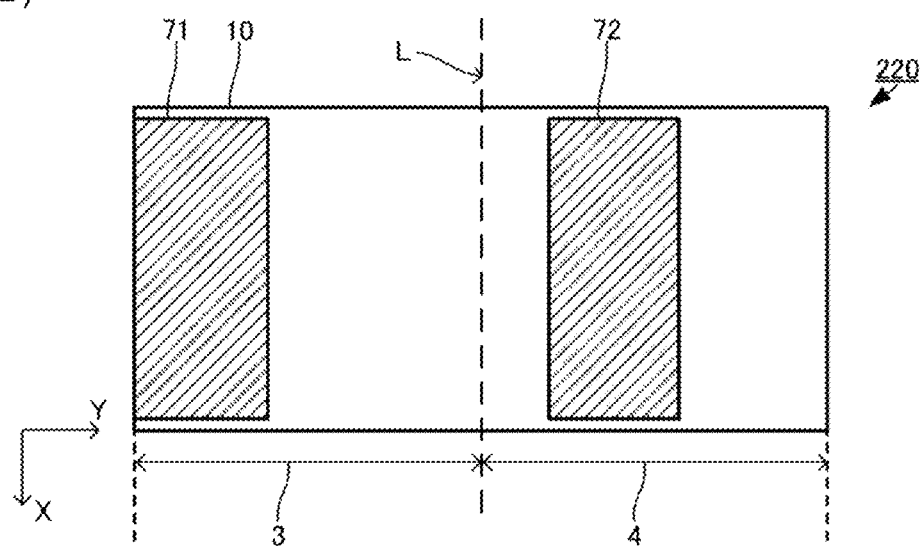
Figure 7C:
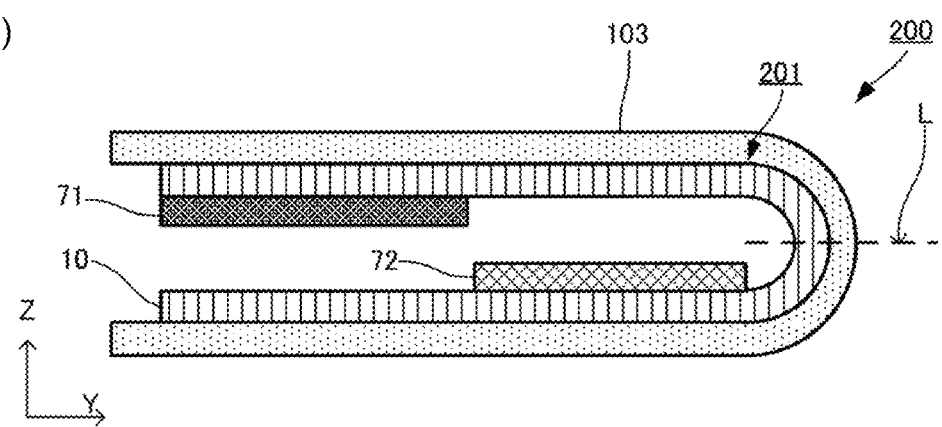

FIGS. 7(A) to 7(C) are diagrams for describing a flexible device 200 according to a second embodiment. FIG. 7(A) is a cross-sectional view of the flexible device 200, FIG. 7(B) is a plan view of a sensor element 220 according to the second embodiment, and FIG. 7(C) is a partial cross-sectional view of the flexible device 200 in a folded state. The flexible device 200 according to the second embodiment has substantially the same configuration as that of the first embodiment except that shape and arrangement of electrodes of the sensor element 220 of a pressure sensor 201 are different. Therefore, in the second embodiment, only differences from the first embodiment will be described, and the description will be omitted.

As illustrated in FIGS. 7(A) to 7(C), the flexible device 200 includes a first electrode 71 and a second electrode 72. The first electrode 71 and the second electrode 72 are shorter in the Y direction than the first electrode 11 and the second electrode 12. In a state in which the flexible device 200 is folded at the folding position L, the first electrode 71 and the second electrode 72 do not overlap in the Z-axis direction. That is, the first electrode 71 and the second electrode 72 do not overlap in plan view (i.e., as viewed in the X-Y plane). Thus, the flexible device 200 can be thinner than the flexible device 100.

In a state in which the flexible device 200 is folded at the folding position L, the absolute values of the charges output from the first electrode 71 and the second electrode 72 may be varied depending on what portion of the surface panel 103 is pressed. For example, in FIG. 7(C), when the pressing operation is received at an area corresponding to the location of the left first electrode 71, the absolute value of the charge output from the first electrode 71 is large. In contrast, when an area to the right of the first electrode 71 (i.e., an area where the first electrode is not formed) is pressed, the absolute value of the charge output from the first electrode 71 is decreased. Therefore, the absolute values of the voltages detected by the processing unit 21 can be varied depending on where the surface panel 103 is pressed.

When the flexible device 200 is pressed with sufficient force, both the first and second electrodes 71 and 72 are deformed and charges are output from each of the first and second electrodes 71 and 72. Therefore, like the first embodiment, the degree of deformation of the housing 102 caused by the pressing operation of the user can be distinguished by the values of the voltages detected from the first and second electrodes 71 and 72, and the flexible device 200 can be prevented from being damaged.

Figure 8A:
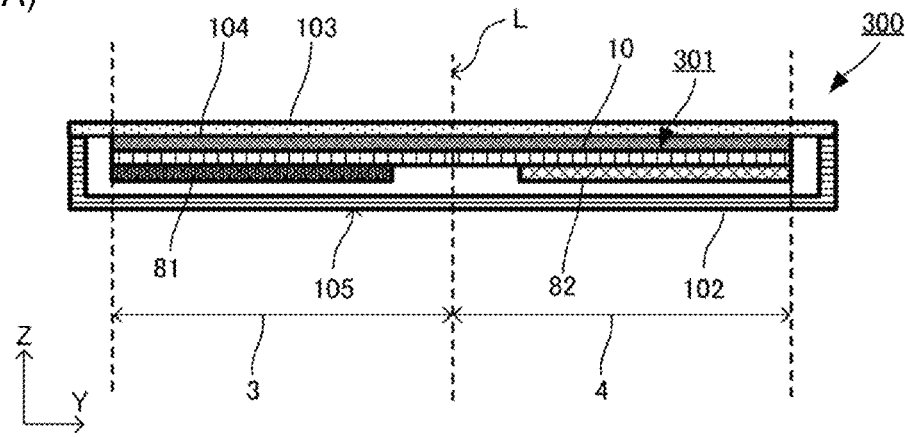
FIGS. 8(A) to 8(C) are diagrams for describing a flexible device according to a third embodiment.
Figure 8B:
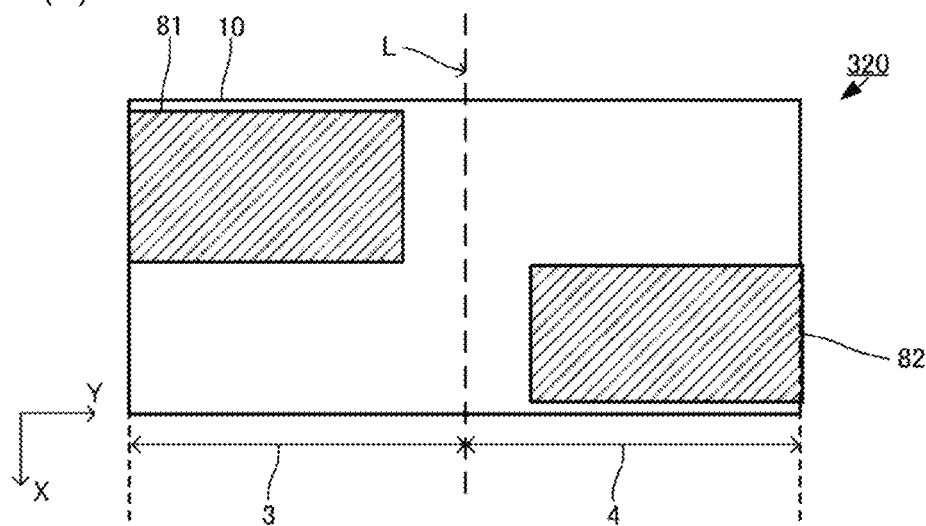
Figure 8C:
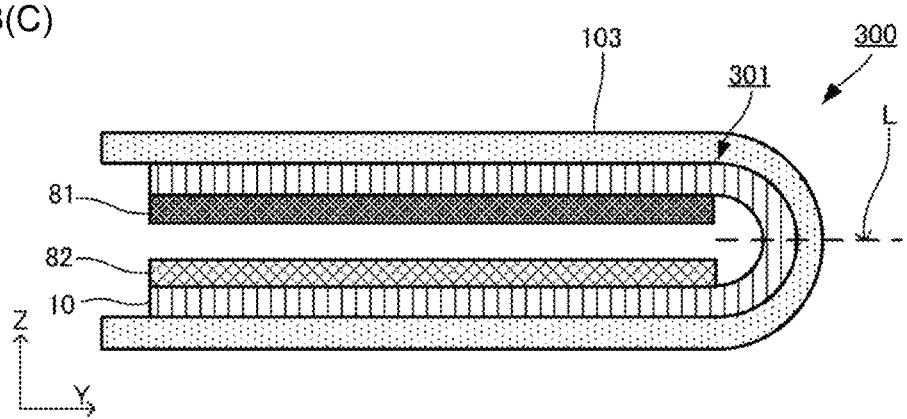

FIGS. 8(A) to 8(C) are views for describing a flexible device according to a third embodiment. FIG. 8(A) is a cross-sectional view of a flexible device 300, FIG. 8(B) is a plan view of a sensor element 320 according to the third embodiment, and FIG. 8(C) is a partial cross-sectional view of the flexible device 300 in a folded state. The flexible device 300 has substantially the same configuration as that of the second embodiment except that shapes and arrangement of electrodes of the sensor element 320 of a pressure sensor 301 are different. Therefore, in the third embodiment, only differences from the second embodiment will be described.

As illustrated in FIGS. 8(A) to 8(C), the flexible device 300 includes first and second electrodes 81 and 82 which are shorter in the X direction than the first and second electrodes 11 and 12 of the first embodiment. Therefore, in a state in which the flexible device 300 is folded at the folding position L, the first electrode 81 and the second electrode 82 do not overlap in plan view (X-Y plane). Thus, in the flexible device 300, the same effects as those of the flexible device 200 of the second embodiment can be obtained.

Although it has been described in the second embodiment and the third embodiment that when each flexible device is folded at the folding position L, the first electrode and the second electrode do not overlap each other in plan view (X-Y plane), these electrodes may have a shape and may be arranged such that only parts thereof overlap.

Although it has been described in each embodiment that the first electrode and the second electrode are formed on the first main surface 14 side of the piezoelectric film 10, the present invention is not limited thereto. These electrodes may be formed on the second main surface side opposite to the first main surface 14. The surface panel 103 may also be formed on the back surface 105 side, and the shape, position, and the like may be appropriately changed.

Although it has been described in each embodiment that the pressure sensor is used to detect the displacement of the housing of the flexible device, any displacement detection sensor may be used as long as the detection sensor detects the displacement. The displacement is not limited to the pressing, but may be bending or twisting. For example, a strain gauge may be used instead of the pressure sensor including the piezoelectric film. An electric resistance value of the strain gauge is changed due to the generated strain. The displacement of the housing of the flexible device is detected based on the electric resistance value of the strain gauge.

Finally, the description of the aforementioned embodiments is illustrative in all respects, and should not be considered as limiting. The scope of the present invention is defined by the claims rather than the aforementioned embodiments. The scope of the present invention includes the scope equivalent to the claims.

DESCRIPTION OF REFERENCE SYMBOLS 1, 201, 301: pressure sensor
3: first region
4: second region
10: displacement detection film (piezoelectric film)
11, 71, 81: first electrode
12, 72, 82: second electrode
14: main surface (first main surface)
22: detection unit
23: warning unit
24: determination unit
100, 200, 300: flexible device
102: housing
L: folding position

The invention claimed is:

1. A combination comprising:
(A) a housing which is foldable along a folding position into a folded state;
(B) a displacement detection sensor comprising:
  (i) a displacement detection film having a main surface;
  (ii) first and second electrodes disposed on first and second spaced regions of the main surface, respectively, the displacement detection film being disposed in the housing so as to straddle the folding position with (a) the first spaced region of the main surface, and with it the first electrode, being located on a first side of the folding position and (b) the second spaced region of the main surface, and with it the second electrode, being located on a second, opposite side of the folding position;
(C) a processor which monitors the state of a pressing operation applied to the housing when it is in the folded state, the processor:
  (i) monitoring the absolute values of outputs of the first and second electrodes;
  (ii) issuing a warning indicating that the housing is in danger of being damaged when it detects that absolute values of outputs of both of the first and second electrodes exceed a first threshold;
  (iii) determining that a first pressing operation has been applied to the housing when the absolute value of the output of at the at least one of the first and second electrodes is equal to or less than a second threshold value, which is lower than the first threshold value; and
  (iv) determining that a second pressing operation has been applied to the housing when the absolute values of the outputs of both the first and second electrodes are larger than the second threshold value and equal to or smaller than the first threshold value.

2. The combination according to claim 1, wherein the first and second electrodes overlap each other in plan view when the housing is in the folded state.

3. The combination according to claim 1, wherein the first and second electrodes completely overlap each other in plan view when the housing is in the folded state.

4. The combination according to claim 1, wherein the first and second electrodes partially overlap each other in plan view when the housing is in the folded state.

5. The combination according to claim 1, wherein the displacement detection film includes a chiral polymer.

6. The combination according to claim 5, wherein the chiral polymer is polylactic acid.

* * * * *